US012593514B2

(12) United States Patent
Chiu et al.

(10) Patent No.: US 12,593,514 B2
(45) Date of Patent: Mar. 31, 2026

(54) SOLAR CELL DESIGN FOR IMPROVED PERFORMANCE AT LOW TEMPERATURE

(71) Applicant: The Boeing Company, Chicago, IL (US)

(72) Inventors: Philip Chiu, La Crescenta, CA (US); Christopher M. Fetzer, Saugus, CA (US); Xingquan Liu, La Crescenta, CA (US)

(73) Assignee: THE BOEING COMPANY, Arlington, VA (US)

( * ) Notice: Subject to any disclaimer, the term of this patent is extended or adjusted under 35 U.S.C. 154(b) by 0 days.

(21) Appl. No.: 16/786,841

(22) Filed: Feb. 10, 2020

(65) Prior Publication Data

US 2020/0335652 A1 Oct. 22, 2020

Related U.S. Application Data

(60) Provisional application No. 62/836,453, filed on Apr. 19, 2019.

(51) Int. Cl.
H10F 10/163 (2025.01)
H10F 19/80 (2025.01)

(52) U.S. Cl.
CPC ......... H10F 10/163 (2025.01); H10F 19/804 (2025.01)

(58) Field of Classification Search
CPC ............. H01L 31/0725; H01L 31/0735; H01L 31/078; H01L 31/03046; H01L 31/0687;
(Continued)

(56) References Cited

U.S. PATENT DOCUMENTS 4,195,305 A 3/1980 Moon
9,842,957 B1 12/2017 Michael et al.
(Continued)

FOREIGN PATENT DOCUMENTS

| CN | 104300015 | 1/2011 |
| CN | 10430015 A | 1/2015 |

(Continued)

OTHER PUBLICATIONS

"A comparative study of BSF layers for GaAs-based single-junction or multijunction concentrator solar cells" Beatriz Galiana et al 2006 Semicond. Sci. Technol. 21 1387. (Year: 2006).*

(Continued)

*Primary Examiner* — Mayla Gonzalez Ramos
(74) *Attorney, Agent, or Firm* — MH2 Technology Law Group LLP

(57) ABSTRACT

A panel including at least one solar cell having a cell comprised of gallium arsenide (GaAs) or indium gallium arsenide (InGaAs) with a back surface field (BSF) comprised of aluminum gallium arsenide (AlGaAs) or indium aluminum gallium arsenide (InAlGaAs) p-type doped for enhanced operation of the solar cell at temperatures less than $-50°$ C. In one example, the back surface field comprises $Al_xGa_{1-x}As$ or $In_{0.01}Al_xGa_{1-x}As$, wherein x is less than about 0.8, for example, 0.2. The back surface field may be p-type doped with zinc (Zn) or carbon (C).

20 Claims, 8 Drawing Sheets

(58) Field of Classification Search

CPC ........... H01L 31/06875; H01L 31/1844; H01L 31/1852; H10F 10/161; H10F 10/163; H10F 19/804

See application file for complete search history.

(56) References Cited

U.S. PATENT DOCUMENTS

| | | | | |
|---|---|---|---|---|
| 2004/0079408 A1* | 4/2004 | Fetzer | ................... | H10F 71/127 |
| | | | | 136/262 |
| 2009/0229662 A1* | 9/2009 | Stan | .................... | H01L 31/0725 |
| | | | | 136/262 |
| 2013/0344645 A1* | 12/2013 | Ahmari | ............... | H10F 71/1276 |
| | | | | 438/94 |
| 2015/0104898 A1* | 4/2015 | Derkacs | .............. | H01L 31/0687 |
| | | | | 438/73 |
| 2016/0359079 A1* | 12/2016 | Clevenger | ........... | H01L 31/1844 |
| 2017/0110614 A1 | 4/2017 | Derkacs | | |
| 2017/0133542 A1 | 5/2017 | Derkacs | | |
| 2019/0181289 A1* | 6/2019 | Derkacs | .............. | H01L 31/0236 |

FOREIGN PATENT DOCUMENTS

| | | | | |
|---|---|---|---|---|
| CN | 106067493 A | 11/2016 | | |
| CN | 106067493 | 5/2018 | | |
| WO | WO-2013162466 A1 * | 10/2013 | ......... | H01L 31/0687 |

OTHER PUBLICATIONS

Masafumi Yamaguchi, Tatsuya Takamoto, Kenji Araki, Nicholas Ekins-Daukes, "Multi-Junction III-V solar cells: current status and future potential", Solar Energy 79 (2005) 78-85 79 (Year: 2004).*

Walker Alexandre W et al: "Impact of photon recycling and luminescence coupling on 111-V single and dual junction photovoltaic devices", Journal of Photonics for Energy, Society of Photo-Optical Instrumentation Engineers, 1000 20th St. Bellingham WA 98225-6705 USA, vol. 5, No. 1, Jan. 1, 2015 (Jan. 1, 2015) , p. 53087-1 to 53087-11.

Extended European Search Report dated Apr. 20, 2020 for EP application No. 20158004.0.

Final Office Action dated Dec. 27, 2021 for U.S. Appl. No. 16/786,832.

Yamaguchi, M., et al., "Multi-junction III—V solar cells: current status and future potential", Solar Energy, 2005, pp. 78-85, vol. 79.

Non-Final Office Action dated Jul. 14, 2021 for U.S. Appl. No. 16/786,832.

Walker et al, Low-temperature characterization of multijunction solar cells using a combined characterization approach, 2018, IEEE 7th World Conference on Photovoltaic Energy Conversion (WCPEC) (A Joint Conference of 45th IEEE PVSC, 28th PVSEC & 34th EU PVSEC), pp. 2248-2251. (Year: 2018).

Germanium Basic Parameters, <https://web.archive.Org/web/20170503211052/http://www.ioffe.ru/SVA/NSM/Semicond/Ge/basic.html> (Year: 2017).

Lee, High Quality Metamorphic Graded Buffers with Lattice-Constants Intermediate to GaAs and InP for Device Applications, 2009 Massachusetts Institute of Technology (Year: 2009).

Non-Final Office Action dated May 12, 2022 for U.S. Appl. No. 16/786,832.

Beatriz Galiana et al: "A comparative study of BSF layers for GaAs-based single-junction or multijunction concentrator solar cells", Semiconductor Science Technology, IOP Publishing Ltd, GB, vol. 21, No. 10, Oct. 1, 2006 (Oct. 1, 2006), pp. 1387-1392.

European Communication dated Mar. 7, 2022 for EP Application No. 20158004.0.

Chinese Office Action dated Dec. 4, 2023 for Chinese Application No. 2020100987061.

Final Office Action dated Dec. 8, 2022 for U.S. Appl. No. 16/786,832.

Chinese Office Action dated Jul. 6, 2024 for Chinese Application No. 202010098772.9.

Yamaguchi et al., "Multi-Junction III-V solar cells: current status and future potential" (2004).

Japanese Notice of Reasons for Rejection (English translation) dated Mar. 5, 2024 for Japanese Patent Application No. 2020-024947.

Japanese Notice of Reasons for Rejection (English translation) dated Mar. 5, 2024 for Japanese Patent Application No. 2020-024978.

Walker et al., "Impact of Photon Recycling and Luninescence Coupling on III-V Photovoltaic Devices," Journal of Photonics for Energy, Sep. 2015, 11 pages.

Examination Report for EP Application No. 20158010.7 dated Feb. 2, 2026, 6 pages.

* cited by examiner

SOLAR CELL DESIGN FOR IMPROVED PERFORMANCE AT LOW TEMPERATURE

CROSS REFERENCE TO RELATED APPLICATIONS

This application claims the benefit under 35 U.S.C. Section 119(e) of the following co-pending and commonly-assigned application:

U.S. Provisional Application Ser. No. 62/836,453, filed on Apr. 19, 2019, by Philip Chiu, Christopher M. Fetzer and Xingquan Liu, entitled "SOLAR CELL DESIGN OPTIMIZED FOR PERFORMANCE AT LOW TEMPERATURE," attorneys' docket number 19-0409-US-PSP;

which application is incorporated by reference herein.

BACKGROUND

1. Field

The disclosure is related generally to a solar cell design for improved performance at low temperature.

2. Background

While standard space-based solar cell are used on missions that operate near or above room temperature, a variety of new applications for solar cells now require operation at temperatures well below −50° C.

For example, UAVs (unmanned aerial vehicles) can operate at altitudes greater than 50,000 feet where temperatures approach −70° C. In another example, deep space exploration to Jupiter and Saturn operates between −140 to −165° C.

As such, solar cell performance at low temperatures is critical for these increasingly common applications. Unfortunately, many solar cells are optimized for near room temperature performance, with significant losses in performance at low temperatures.

Thus, there is a need for solar cell designs for devices optimized for operation at temperatures less than about −50° C.

SUMMARY

The present disclosure describes a device comprising: a panel including at least one solar cell having a cell comprised of gallium arsenide (GaAs) or indium gallium arsenide (InGaAs) with a back surface field (BSF) comprised of aluminum gallium arsenide (AlGaAs) or indium aluminum gallium arsenide (InAlGaAs) p-type doped for enhanced operation of the solar cell at temperatures less than about −50° C.

The back surface field may comprise $Al_xGa_{1-x}As$ or $In_{0.01}Al_xGa_{1-x}As$, wherein x is less than about 0.8, for example, wherein x=0.2. The back surface field may be p-type doped with zinc (Zn) or carbon (C).

The back surface field may form a heterojunction with a middle cell (MC) base having a lower barrier height as compared to a middle cell back surface field comprised of gallium indium phosphide (GaInP).

The back surface field may form a heterojunction with a middle cell base having a barrier height of about 90 meV or less in a valance band. The barrier height allows for thermalization of majority carrier holes down to temperatures less than about −50° C., which eliminates resistive losses associated with the barrier. The barrier height eliminates resistive losses.

The solar cell's efficiency increases monotonically with decreasing temperature for a temperature range between room temperature and a temperature of about −150° C.

The present disclosure also describes a method comprising: fabricating a panel including at least one solar cell having a middle cell back surface field comprised of aluminum gallium arsenide doped with zinc for enhanced operation of the solar cell at temperatures less than about −50° C.

In addition, the present disclosure describes a method comprising: generating a current using a panel including at least one solar cell having a cell comprised of gallium arsenide (GaAs) or indium gallium arsenide (InGaAs) with a back surface field comprised of aluminum gallium arsenide (AlGaAs) or indium aluminum gallium arsenide (InAlGaAs) p-type doped for enhanced operation of the solar cell at temperatures less than about −50° C.

Finally, the present disclosure describes a device comprising: a panel including at least one solar cell having a middle cell base and a middle cell back surface field for enhanced operation of the solar cell at temperatures less than about −50° C.; wherein the base is comprised of gallium arsenide (GaAs) or gallium indium arsenide (GaInAs), and the back surface field is comprised of a material, such that: the back surface field has a valence band offset of below about 100 meV relative to the base; the back surface field has either a type-I or type-II band alignment relative to the base; and the back surface field maintains a conduction band offset of greater than about 0 meV relative to the base, so that the back surface field acts as a hetero-step passivation layer and reflects minority carrier electrons back to a p-n junction to be collected.

A lattice constant of the base surface field may be about the same as a lattice constant of the middle cell base.

The back surface field may be comprised of $Al_xGa_{1-x}As$, where x is less than about 0.8.

The back surface field may be comprised of aluminum gallium indium arsenide ($Al_xGa_{1-x-y}In_yAs$), where x is less than about 0.8 and y is chosen so that a lattice constant of the back surface field is about the same as a lattice constant of the base.

The back surface field may be comprised of aluminum gallium arsenide antimony ($Al_xGa_{1-x}As_{1-y}Sb_y$), where x is less than about 0.8 and y is chosen to match the type-I or type-II band alignment relative to the base.

In each instance, a space vehicle may include the panel.

DRAWINGS

Referring now to the drawings in which like reference numbers represent corresponding parts throughout:

DETAILED DESCRIPTION

In the following description, reference is made to the accompanying drawings which form a part hereof, and in which is shown by way of illustration a specific example in which the disclosure may be practiced. It is to be understood that other examples may be utilized and structural changes may be made without departing from the scope of the present disclosure.

Overview

This disclosure describes a design rule for solar cells that improves their performance at low temperatures, for example, less than −50° C.

Specifically, the main constraint in low temperature performance is the presence of heterojunction resistance that increases exponentially with decreasing temperature. The main heterojunction resistance in a standard triple junction (3J) solar cell occurs between a middle cell base and BSF. The offset in materials in the valence band acts as a rectification diode. At nominal operating temperatures, the barrier is easily surmounted by photogenerated holes to be collected in the circuit. At low temperatures, the interrupt, or hetero-step, in the valence band energies acts as a rectification barrier.

There have been previous attempts to address this issue of 3J solar cell performance at low temperatures.

One attempt was to use the standard 3J space solar cells in low temperatures and tolerate any low temperature performance degradations.

Another attempt was to change the p-type doping in the middle cell base near an interface with the middle cell BSF. Changes in doping can narrow the width of the heterojunction barrier, allowing for increased tunneling transport across the heterojunction barrier and reduced heterojunction resistance. This mitigates the issue, but is tenuous at best depending on the temperature and exact doping level.

This disclosure reduces this heterojunction resistance by replacing the baseline BSF material to reduce, eliminate, or re-orient the heterojunction barrier. Specifically, one example described in this disclosure describes a new solar cell having a middle cell BSF comprised of AlGaAs or InAlGaAs for improving performance of the solar cell at temperatures less than about −50° C. In one example, the new BSF comprises $Al_xGa_{1-x}As$ or $In_{0.01}Al_xGa_{1-x}As$, wherein x=0.2.

Experimental data demonstrates an increase in efficiency of 25% for the new BSF at −150° C. relative to the baseline BSF. In fact, the new solar cell performance is 20-30% greater than the baseline solar cell.

Technical Description

Figures 1A, 1B:
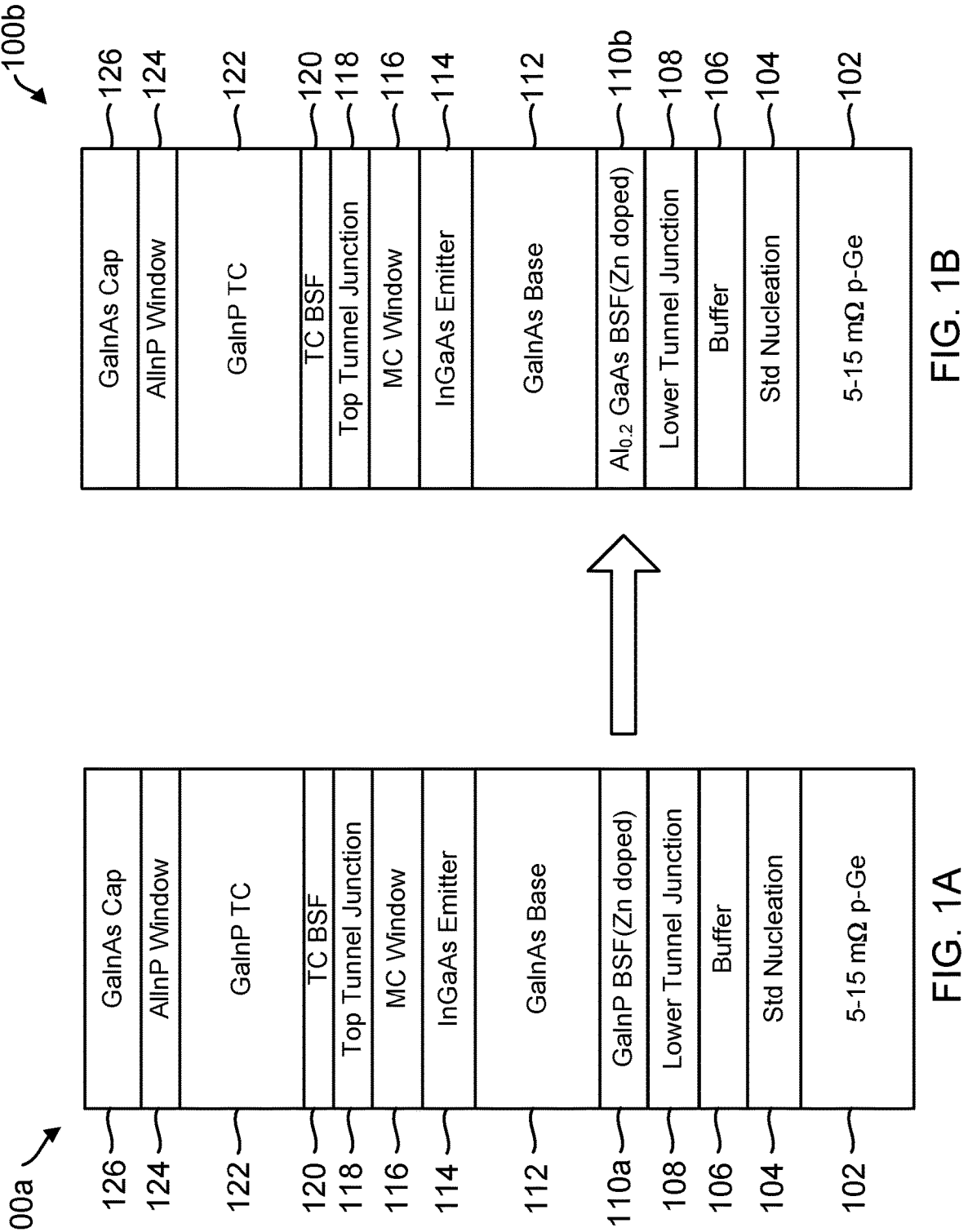
FIGS. 1A and 1B are layer schematics of triple junction solar cells, illustrating a baseline solar cell in FIG. 1A and a new solar cell in FIG. 1B.

FIGS. 1A and 1B are layer schematics, each showing a cross-section of a device comprising baseline and new III-V 3J solar cells 100a, 100b, respectively.

FIG. 1A shows the baseline I-V 3J solar cell 100a as currently manufactured. The solar cell 100a includes a 5-15 mΩ p-doped germanium (p-Ge) substrate 102, upon which is deposited and/or fabricated a standard (std) nucleation layer 104, a buffer layer 106, a lower tunnel junction 108, a GaInP BSF 110a that is doped with Zn, a middle cell (MC) comprised of a GaInAs base 112 and an InGaAs emitter 114, an MC window 116, a top tunnel junction 118, a top cell (TC) BSF 120 that is comprised of GaInP, a TC comprised of GaInP 122, an aluminum indium phosphide (AlInP) window 124, and a GaInAs cap 126.

FIG. 1B shows the new III-V 3J solar cell 100b according to this disclosure, which substitutes an AlGaAs BSF 110b that is p-type doped with Zn, for the GaInP BSF 110a in the middle cell of the baseline solar cell 100a. In one example, the BSF 110b comprises $A_xGa_{1-x}As$, wherein x=0.2. In an alternative example, the BSF 110b may comprise $In_{0.01}Al_xGa_{1-x}As$, wherein x=0.2. In an alternative example, the BSF 110b may be p-type doped with carbon (C). The solar cells 100a, 100b may include other features not illustrated for the purposes of simplifying the drawings, such as an anti-reflection coating, front and back metal contacts, etc.

Figure 2:
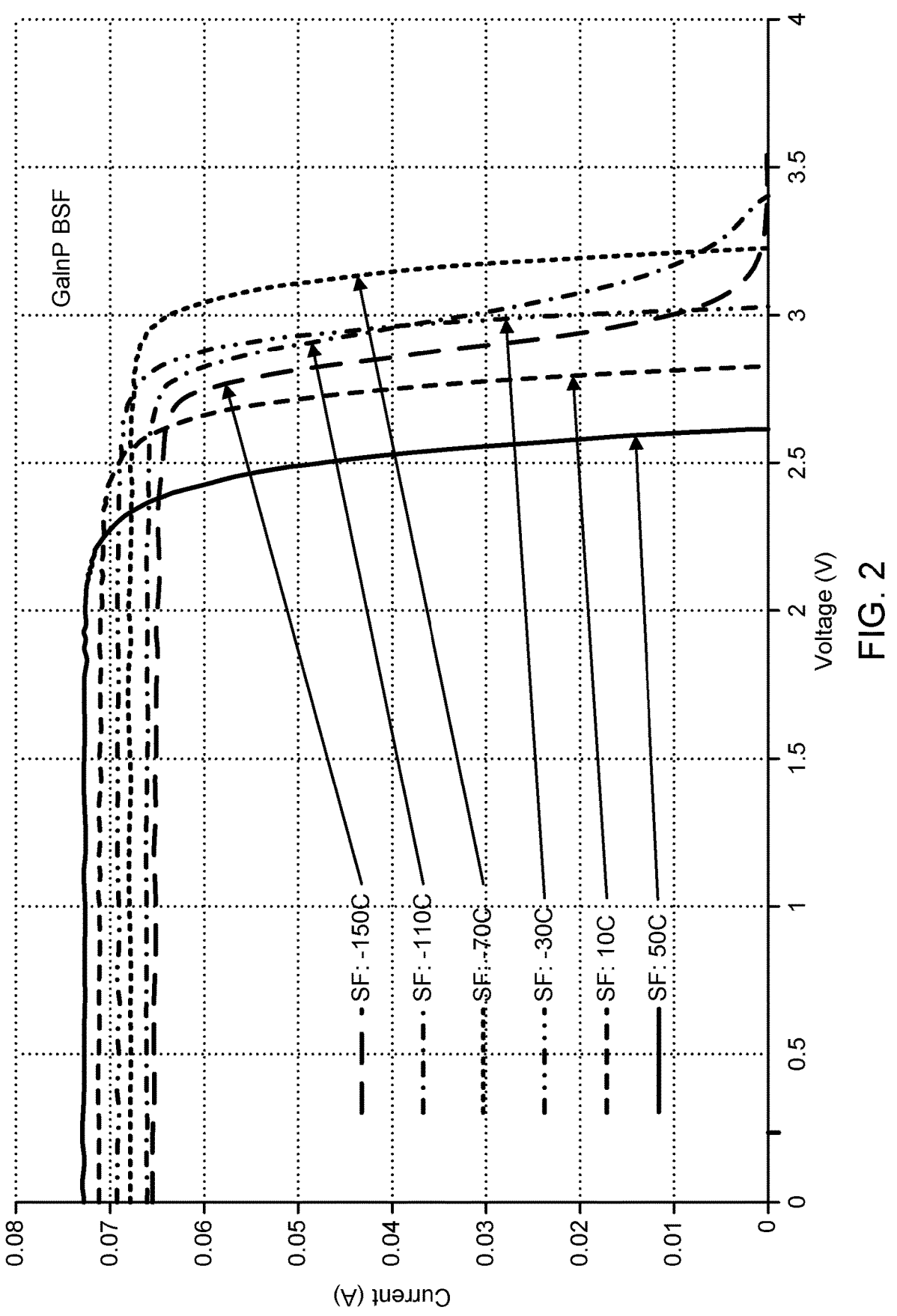
FIG. 2 is a graph of LIV (light-current-voltage) curves measured from −150° C. to 30° C. for the baseline solar cell.

FIG. 2 is a graph of current (A) vs. voltage (V) illustrating the consequences of using the GaInP BSF 110a in the middle cell of the baseline solar cell 100a. From room temperature down to −50° C., the LIV curves are well behaved, with linear behavior near Voc (open circuit voltage). The efficiency increases with decreasing temperature in this range due to the increasing Voc. However, for temperatures less than −50° C., the LIV show non-linearities near the Voc. These non-linearities result in losses in the fill factor and significant losses in solar cell 100a performance. This non-linearity is caused by a leaky diode rectification.

Figures 3A, 3B:
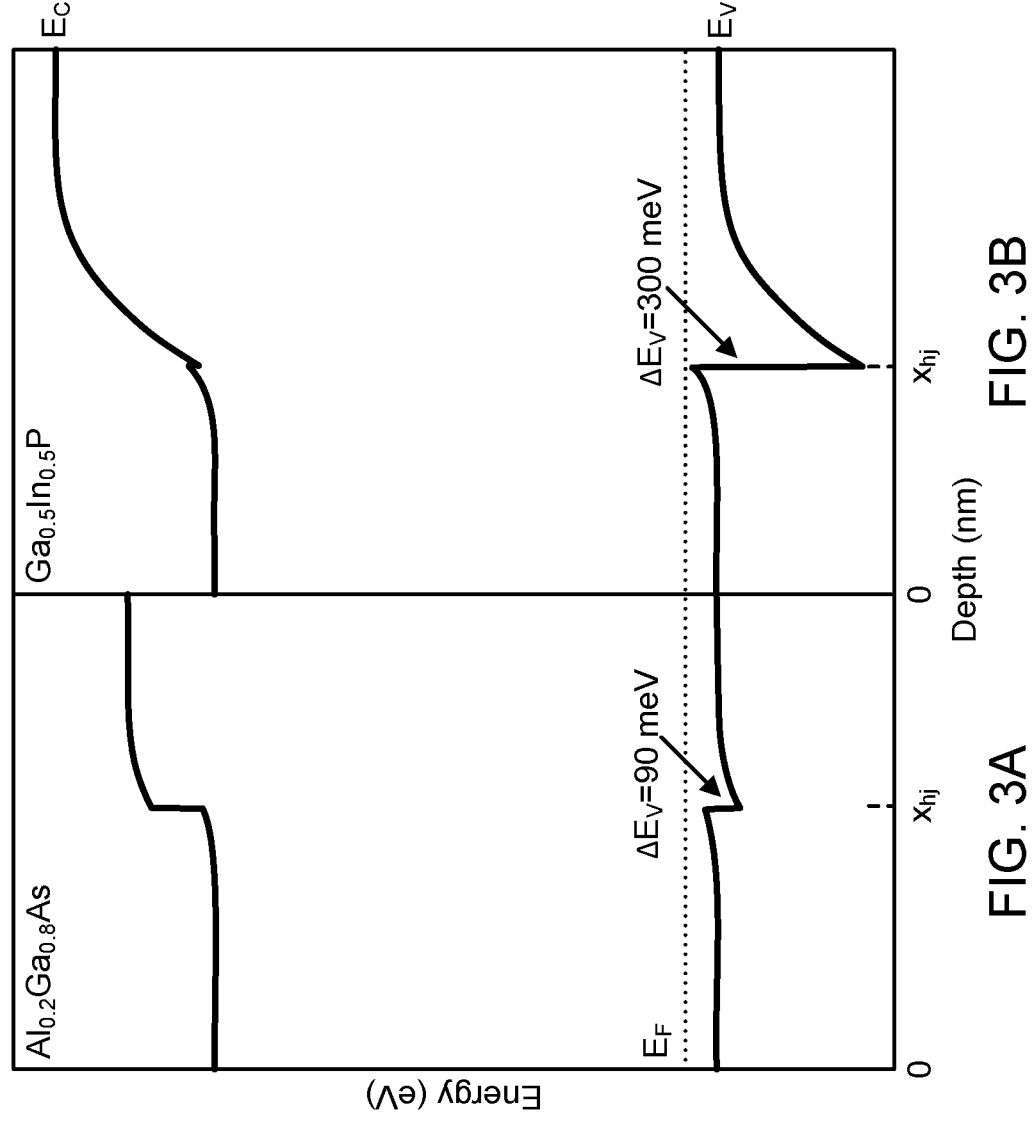
FIGS. 3A and 3B are graphs providing a comparison of bandgap diagrams for the back surface fields of the new and baseline solar cells to a base heterojunction.

FIGS. 3A and 3B are graphs providing a comparison of bandgap diagrams for the AlGaAs BSF 110b and the GaInP BSF 110a, both of which form a heterojunction with the GaInAs base 112.

As shown in FIG. 3A, modeling indicates that the AlGaAs BSF 110b forms a heterojunction with the middle cell base 112 having a lower barrier height of about 90 meV or less in the valence band, as compared to the GaInP BSF 110a. The lower barrier height allows for thermalization of majority carrier holes down to much lower temperatures, i.e., temperatures less than about −50° C., which eliminates resistive losses associated with the barrier.

As shown in FIG. 3B, the GaInP BSF 110a forms a significantly higher heterojunction barrier height of 300 meV in the valance band. At temperatures above −50° C., there is sufficient thermal energy for majority carrier holes to thermalize over this barrier. At temperatures less than −50° C., there is insufficient thermal energy, causing heterojunction resistance that manifests itself in the form a nonlinear behavior in the solar cell 100a LIV curve near Voc. Therefore, increasing doping does not eliminate the issue.

Figure 4C:
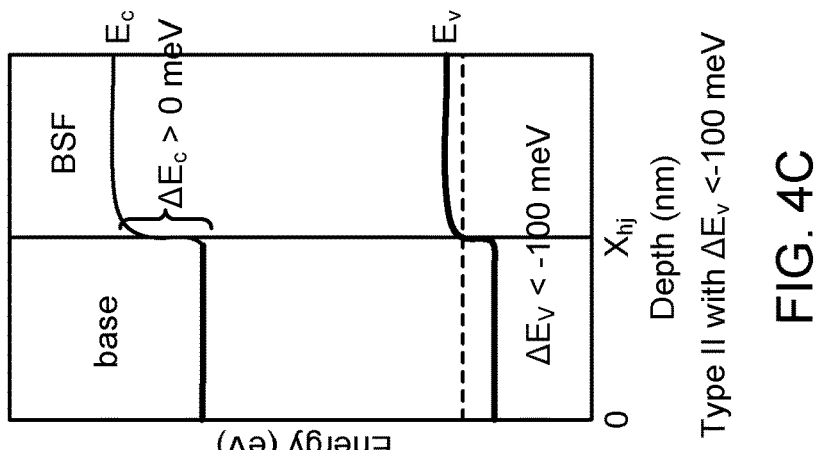
FIGS. 4A, 4B and 4C are graphs showing possible band alignments for different material situations that improve low-temperature performance.
Figure 4B:
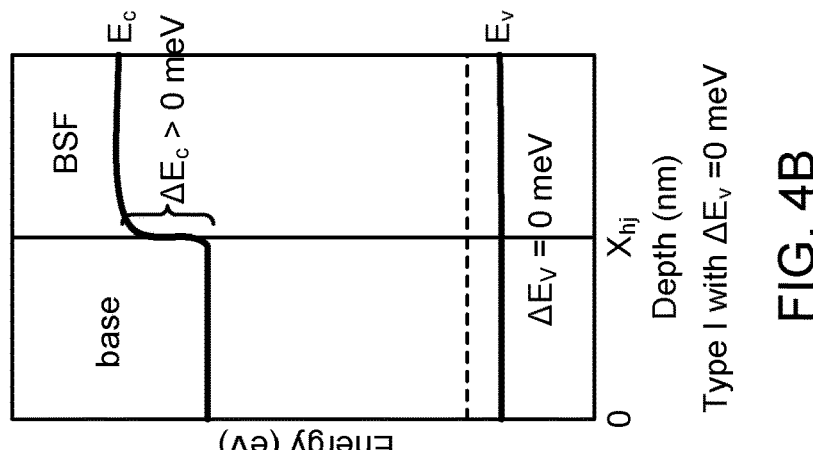
Figure 4A:
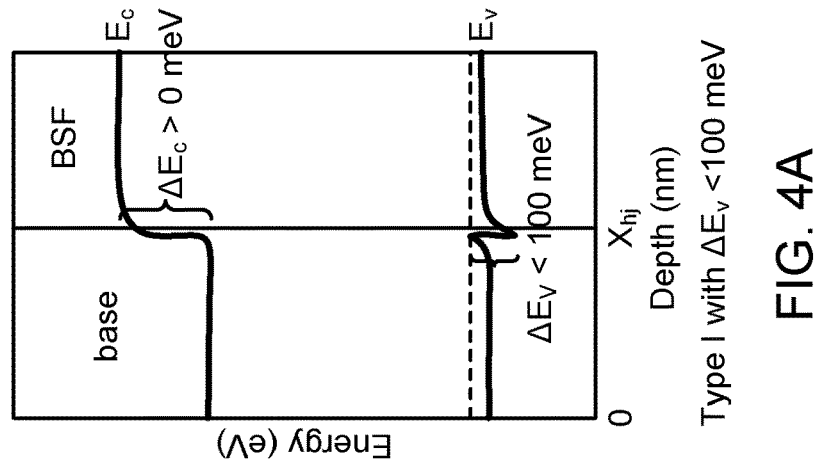

FIGS. 4A, 4B and 4C are graphs showing possible band alignments for different material situations that improve low-temperature performance, e.g., below −50° C.

FIG. 4A shows a similar case to that in FIG. 3A with a type-I offset where the valence band is near to that of the base material and a small offset of less than 100 meV is obtained. This limit is important as at temperatures below −50° C., the energy of the hole to surmount the barrier is approximately no more than five times the standard thermal energy of kT or 19.3 meV at −50° C.

FIG. 4B shows a potential design where no offset occurs in the valence band between the base and BSF.

FIG. 4C shows a potential design where the offset is type-II and there is a negative offset and the BSF valence band energy is higher than that of the base material. Again, a limitation of near 100 meV exists for a type-II band alignment material as the hetero-step offset will form a rectification barrier.

For material selection, the actual energy level of the BSF material varies and are well understood by those skilled in the art of III-V semiconductor devices. Selection of BSF materials for GaAs or GaInAs base subcells would be best chosen from materials that follow the main criteria: first, they must have a valence band offset of below 100 meV; second, they may be either type-I or type-II band alignment relative to the base; and third, they must maintain a band offset of greater than 0 meV for the conduction band so that they continue to act as a hetero-step passivation layer and reflect minority carrier electrons away from the interface and back to the p-n junction to be collected.

Lastly, the choice of material is superior if a lattice constant of the BSF is near or about the same as a lattice constant of the base. This criterion allows for the smallest number of defects to be created at the interface and the BSF reduces the interfacial recombination velocity of the minority carriers.

As an example for GaAs and GaInAs, the best choices for BSF materials could be selected from: $Al_xGa_{1-x}As$, where x is less than 0.8; $Al_xGa_{1-x-y}In_yAs$, where x is less than 0.8 and y is chosen to allow the alloy BSF to approximately match the base material lattice constant; $Al_xGa_{1-x}As_{1-y}Sb_y$, where x is less than 0.8 and y is chosen to match the type-I or type-II alignment. Various other combinations may be chosen from multinary alloys of GaNAs, AlGaAs, AlGaAsSb, AlGaPAs, AlGaPAsSb, AlGaInAs, AlGaInPAs, AlGaInPAsSb, AlGaAsBi, AlGaInPAsBi, BGaAs, BAlGaAs, BAlGaInAs, etc., and further examples of material alloys of combinations above. Further combinations may be proposed for subcells of other base materials, such as GaInP, AlGaInP, AlGaInAs, GaInNAs, GaInNAsSb, InPGaInAs, and GaAsSb, so long as the criteria outlined above are followed.

Figure 5:
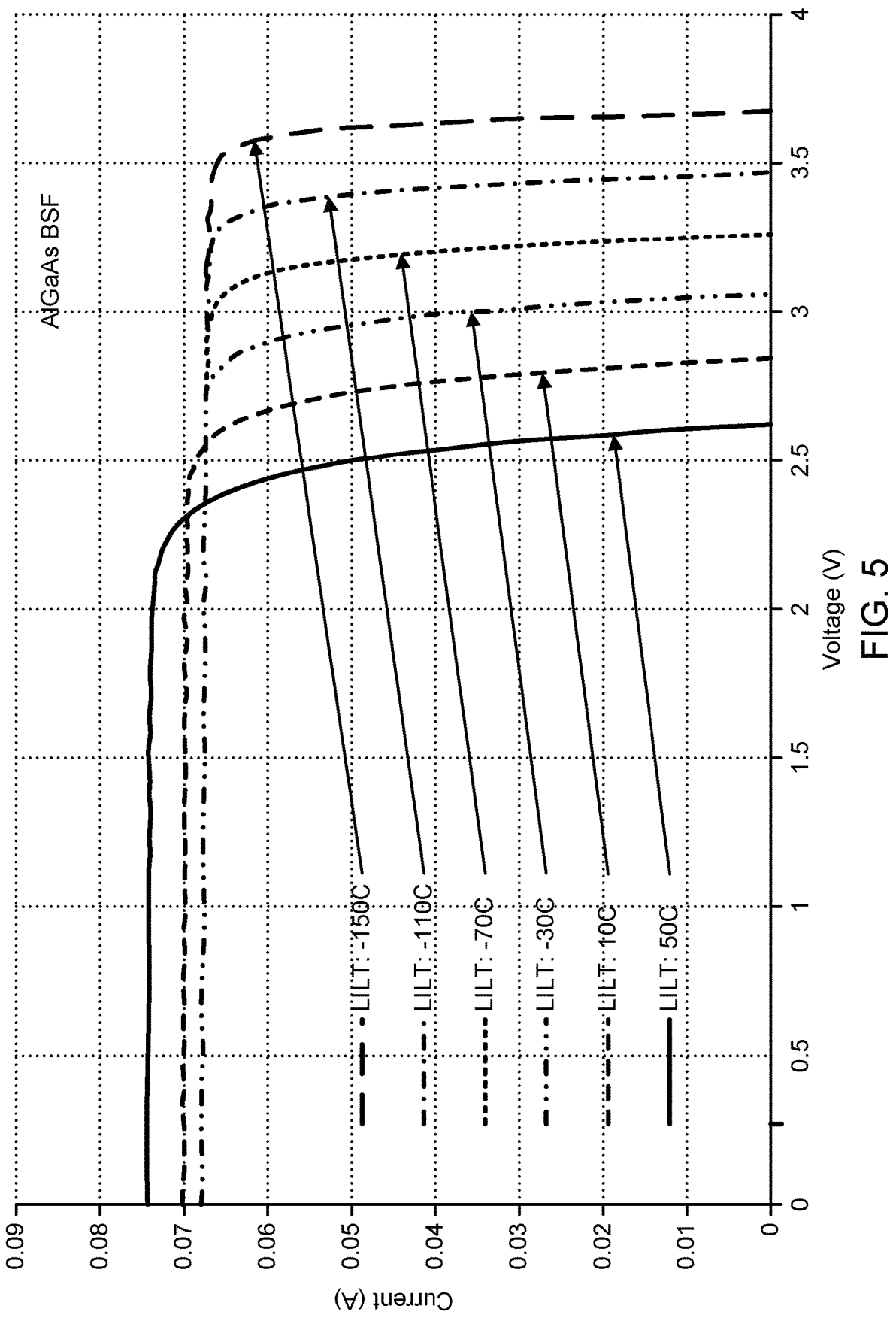
FIG. 5 is a graph of LIV curves measured from −150° C. to 30° C. for the new solar cell.

FIG. 5 is a graph of current (A) vs. voltage (V) illustrating the effect of the reduced heterojunction barrier on the new solar cell's 100b performance. In contrast to the baseline solar cell 100a with the GaInP BSF 110a illustrated in FIG. 2, the new solar cell 100b with the AlGaAs BSF 110b shows well behaved LIV curves, particularly near Voc, down to the lowest measured temperature of –150° C. The new solar cell 100b with the AlGaAs BSF 110b still exhibits increasing Voc with decreasing temperature.

Figure 6:
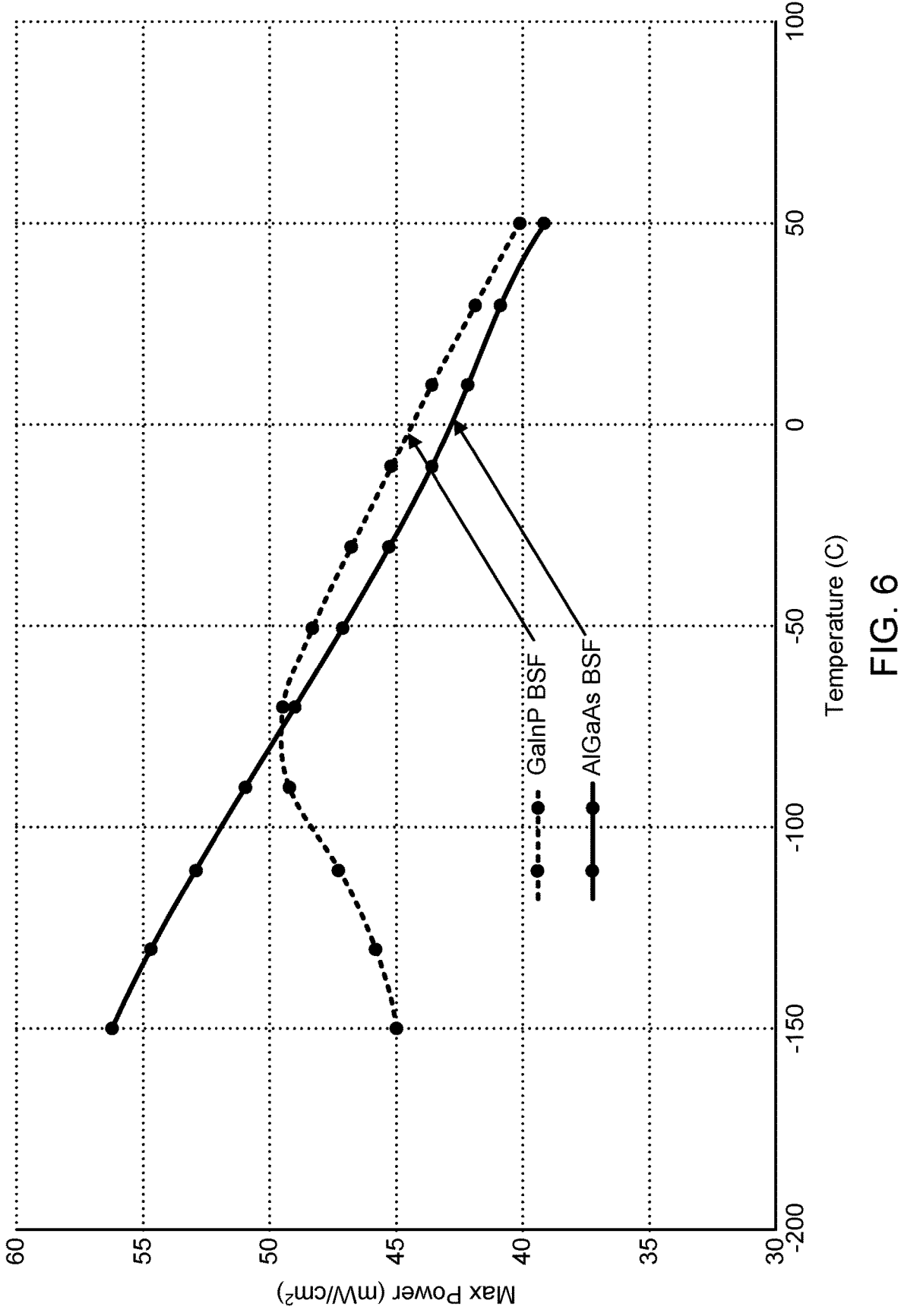
FIG. 6 is a graph of maximum power as a function of temperature for the back surface fields of the baseline and new solar cells.

FIG. 6 is a graph of maximum power (mW/cm²) vs. temperature (C) that compares the baseline solar cell 100a with the GaInP BSF 110a to the new solar cell 100b with the AlGaAs BSF 110b.

For the GaInP BSF 110a case, the efficiency increases due to the increasing voltage for the baseline solar cell 100a from room temperature to –50° C. From temperatures of –50° C. to –150° C., the efficiency of the baseline solar cell 100a decreases with decreasing temperature due to the high heterojunction resistance and associated non-linearities near Voc.

For the AlGaAs BSF 110b case, the efficiency of the new solar cell 100b increases monotonically with decreasing temperature for a temperature range between room temperature of about 20° C. to 30° C. and a temperature of about –150° C. This sharply contrasting behavior results in a divergence in low temperature cell performance starting at –50° C. At –150° C., the difference in new solar cell 100b efficiency is 25%, which is a significant improvement for solar cells 100a, 100b that operate in these conditions.

Alternatives and Modifications

The description set forth above has been presented for purposes of illustration and description, and is not intended to be exhaustive or limited to the examples described. Many alternatives and modifications may be used in place of the specific description set forth above.

For example, although AlGaAs and InAlGaAs are the materials studied most in depth thus far, multiple other potential materials could also be used. Compositions of AlGaAs other than $Al_{0.2}Ga_{0.8}As$ and InAlGaAs other than $In_{0.01}Al_{0.2}Ga_{0.8}As$ may be used, as well as InGaAsP alloy lattice matched to Ge/GaAs substrates.

In another example, although this disclosure describes the widely adopted triple junction solar cell, it could be broadened to cover any instance of a single junction, double junction, or other multiple junction solar cell designed to include materials that lower heterojunction resistance for majority carriers. This would include any BSF-to-base transition or window-to-emitter transition for the valence or conduction bands, respectively.

In yet another example, although this disclosure describes the new solar cell 100b generally, and BSF 110b specifically, as comprising certain materials, alternatives may describe the new solar cell 100b and BSF 110b as consisting of, or consisting essentially of, these or other materials.

Similarly, although this disclosure describes the new solar cell 100a performing in a desired manner at a temperature of about –50° C. or less, alternatives may describe the new solar cell 100 as performing at a temperature of about –100° C. or less, –150° C. or less, or other lesser temperatures.

Aerospace Applications

Figure 7A:
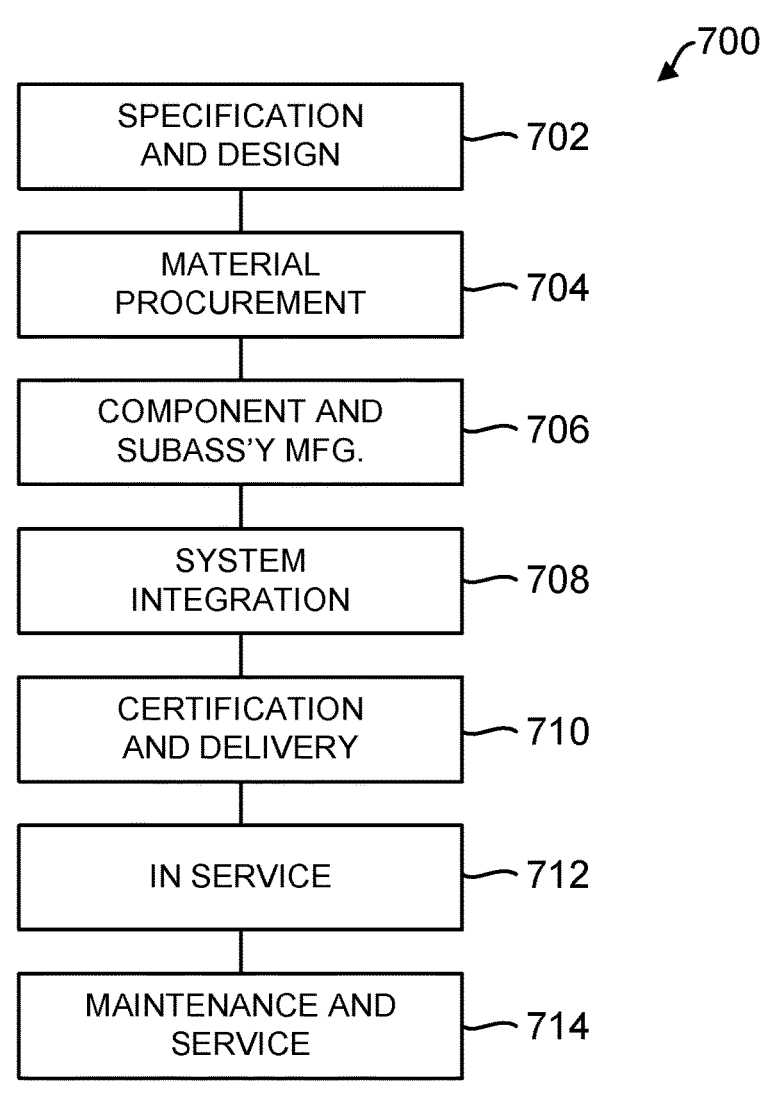
FIG. 7A illustrates a method of fabricating a solar cell, solar cell panel and/or satellite.
Figure 7B:
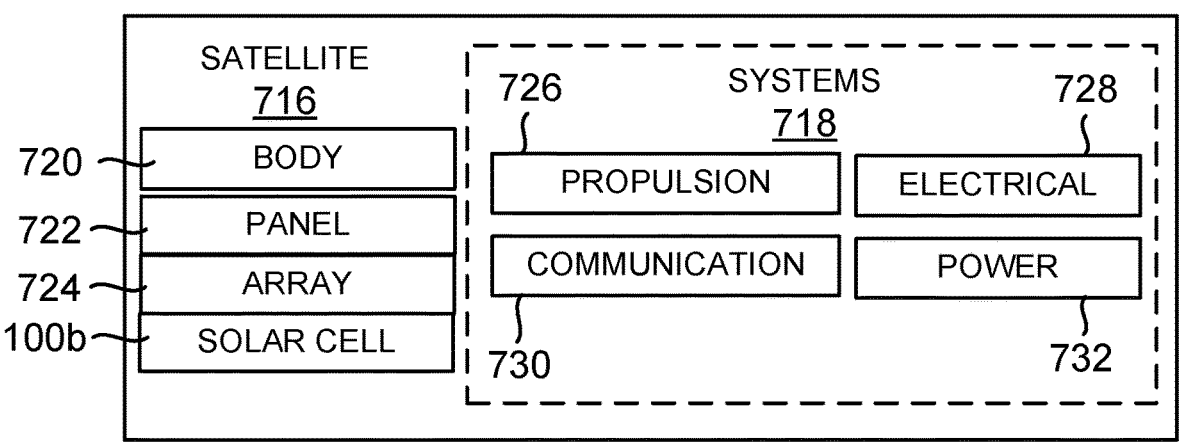
FIG. 7B illustrates a resulting satellite having a solar cell panel comprised of solar cells.

Examples of the disclosure may be described in the context of a method 700 of fabricating a solar cell, solar cell panel and/or aerospace vehicle such as a satellite, comprising steps 702-714, as shown in FIG. 7A, wherein the resulting satellite 716 comprised of various systems 718 and a body 720, including a panel 722 comprised of an array 724 of one or more solar cells 100b is shown in FIG. 7B.

As illustrated in FIG. 7A, during pre-production, exemplary method 700 may include specification and design 702 of the satellite 716, and material procurement 704 for same. During production, component and subassembly manufacturing 706 and system integration 708 of the satellite 716 takes place, which include fabricating the satellite 716, panel 722, array 724 and solar cells 100b. Thereafter, the satellite 716 may go through certification and delivery 710 in order to be placed in service 712. The satellite 716 may also be scheduled for maintenance and service 714 (which includes modification, reconfiguration, refurbishment, and so on), before being launched.

Each of the processes of method 700 may be performed or carried out by a system integrator, a third party, and/or an operator (e.g., a customer). For the purposes of this description, a system integrator may include without limitation any number of manufacturers and major-system subcontractors; a third party may include without limitation any number of venders, subcontractors, and suppliers; and an operator may be a satellite company, military entity, service organization, and so on.

As shown in FIG. 7B, the satellite 716 fabricated by exemplary method 700 may include various systems 718 and a body 720. Examples of the systems 718 included with the satellite 716 include, but are not limited to, one or more of a propulsion system 726, an electrical system 728, a communications system 730, and a power system 732. Any number of other systems also may be included.

Functional Block Diagram

7

Figure 8:
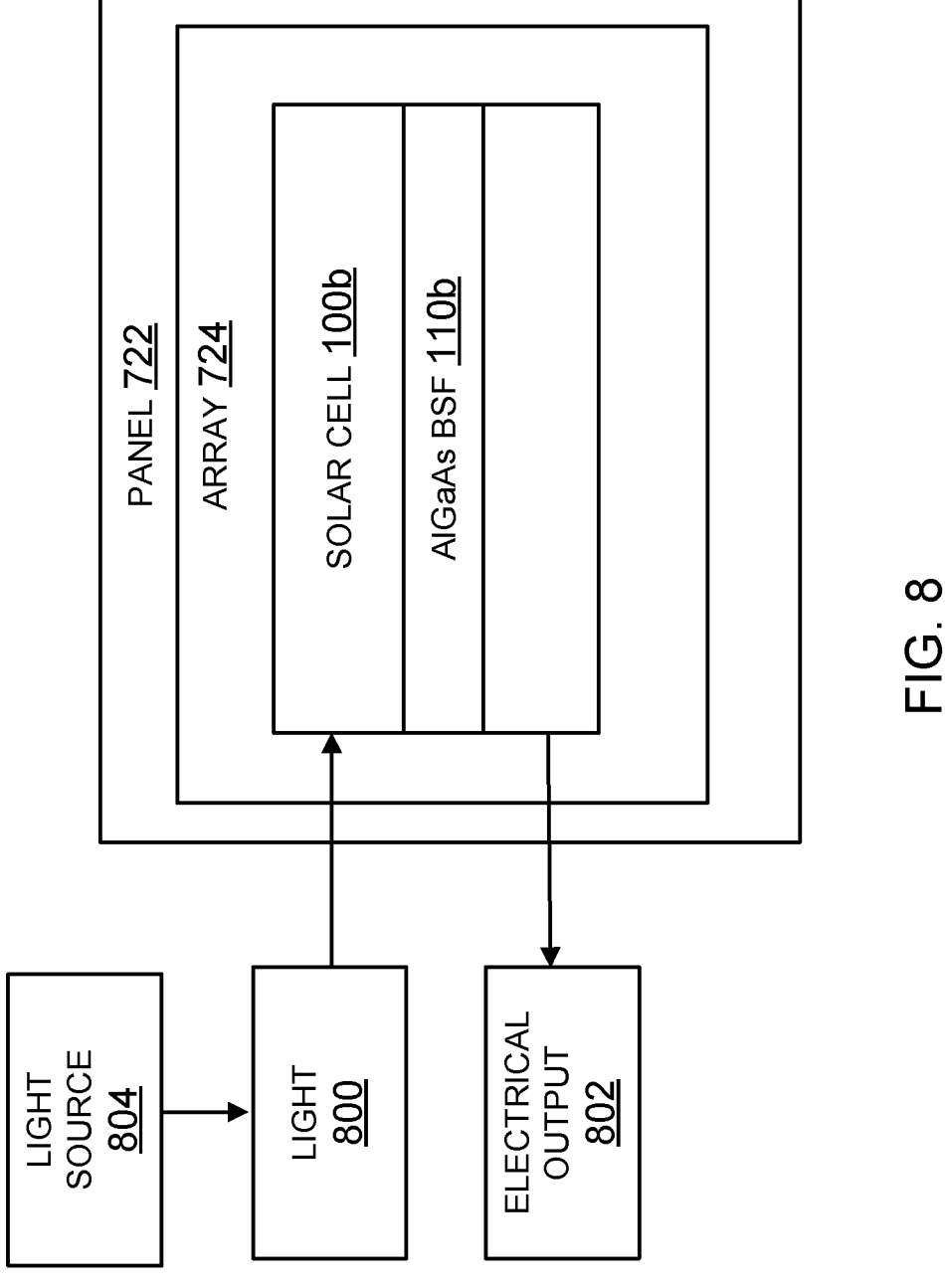
FIG. 8 is an illustration of the solar cell panel in the form of a functional block diagram.

FIG. 8 is an illustration of the panel 722 in the form of a functional block diagram, according to one example. The panel 722 is comprised of the array 724, which is comprised of one or more of the solar cells 100b individually attached to the panel 722. At least one of the solar cells 100b has an AlGaAs BSF 110b. Each of the solar cells 100b absorbs light 800 from a light source 802 and generates an electrical output 804 in response thereto.

What is claimed is:

1. A device, comprising:

a panel including at least one solar cell optimized for enhanced operation at temperatures less than about −50° C., the at least one solar cell including:

a middle cell comprised of an indium gallium arsenide (InGaAs) emitter and a gallium indium arsenide (GaInAs) base deposited on a back surface field (BSF), wherein the back surface field is comprised of aluminum gallium arsenide ($Al_xGa_{1-x}As$) or indium aluminum gallium arsenide ($In_{0.01}Al_xGa_{1-x}As$), where x is less than 0.8, the back surface field forms a heterojunction with the GaInAs base having a barrier height of 90 meV or less in a valance band, the back surface field is lattice matched to the GaInAs base for reducing an interfacial recombination velocity of minority carriers at an interface between the back surface field and the GaInAs base, the back surface field is p-type doped with zinc (Zn), and the back surface field has a valence band offset of less than 100 meV relative to the GaInAs base; and a nucleation layer surrounded by and in direct contact with a substrate and a buffer, the buffer being surrounded by and in direct contact with the nucleation layer and a tunnel junction.

2. The device of claim 1, wherein x=0.2.

3. The device of claim 1, wherein the back surface field forms a heterojunction with the base having a lower barrier height as compared to a back surface field comprised of gallium indium phosphide (GaInP).

4. The device of claim 1, wherein the barrier height allows for thermalization of majority carrier holes down to temperatures less than about −50° C., which eliminates resistive losses associated with the barrier.

5. The device of claim 1, wherein the barrier height eliminates resistive losses.

6. The device of claim 1, wherein the solar cell's efficiency increases monotonically with decreasing temperature for a temperature range between room temperature and a temperature of about −150° C.

7. The device of claim 1, further comprising a space vehicle including the panel.

8. A method, comprising:

fabricating a panel including at least one solar cell optimized for enhanced operation at temperatures less than about −50° C., the at least one solar cell including:

a middle cell comprised of an indium gallium arsenide (InGaAs) emitter and a gallium indium arsenide (GaInAs) base deposited on a back surface field (BSF), wherein the back surface field is comprised of aluminum gallium arsenide ($Al_xGa_{1-x}As$) or indium aluminum gallium arsenide ($In_{0.01}Al_xGa_{1-x}As$), where x is less than 0.8,

the back surface field forms a heterojunction with the GaInAs base having a barrier height of 90 meV or less in a valance band, the back surface field is lattice matched to the GaInAs base for reducing an interfacial recombination velocity of minority carriers at an interface between the back surface field and the GaInAs base, the back surface field is p-type doped with zinc (Zn), and the back surface field has a valence band offset of less than 100 meV relative to the GaInAs base; and a nucleation layer surrounded by and in direct contact with a substrate and a buffer, the buffer being surrounded by and in direct contact with the nucleation layer and a tunnel junction.

9. The method of claim 8, wherein x=0.2.

10. A method, comprising:

generating a current using a panel including at least one solar cell optimized for enhanced operation at temperatures less than about −50° C., the at least one solar cell including:

a middle cell comprised of an indium gallium arsenide (InGaAs) emitter and a gallium indium arsenide (GaInAs) base deposited on a back surface field (BSF), the back surface field is comprised of aluminum gallium arsenide ($Al_xGa_{1-x}As$) or indium aluminum gallium arsenide ($In_{0.01}Al_xGa_{1-x}As$), where x is less than 0.8, the back surface field forms a heterojunction with the GaInAs base having a barrier height of 90 meV or less in a valance band, the back surface field is lattice matched to the GaInAs base for reducing an interfacial recombination velocity of minority carriers at an interface between the back surface field and the GaInAs base, the back surface field is p-type doped with zinc (Zn), and the back surface field has a valence band offset of less than 100 meV relative to the GaInAs base; and a nucleation layer surrounded by and in direct contact with a substrate and a buffer, the buffer being surrounded by and in direct contact with the nucleation layer and a tunnel junction.

11. The method of claim 10, wherein x=0.2.

12. A device, comprising:

a panel including at least one solar cell having a middle cell (MC) with an emitter, a base and a back surface field (BSF) for enhanced operation of the solar cell at temperatures less than about −50° C.;

wherein the base is comprised of gallium indium arsenide (GaInAs) deposited on the back surface field, the emitter is comprised of indium gallium arsenide (InGaAs) deposited on the base, and the back surface field is comprised of aluminum gallium arsenide ($Al_xGa_{1-x}As$) or indium aluminum gallium arsenide ($In_{0.01}Al_xGa_{1-x}As$), where x is less than 0.8, such that:

the back surface field has a valence band offset of below 100 meV relative to the GaInAs base;

the back surface field has either a type-I or type-II band alignment relative to the GaInAs base;

the back surface field maintains a conduction band offset of greater than 0 meV relative to the GaInAs base, so that the back surface field acts as a hetero-step passivation layer and reflects minority carrier electrons back to a p-n junction to be collected;

the back surface field is lattice matched to the GaInAs base for reducing an interfacial recombination velocity of the minority carriers at an interface between the back surface field and the base; and the back surface field is p-type doped with zinc (Zn), and a nucleation layer surrounded by and in direct contact with a substrate and a buffer, the buffer being surrounded by and in direct contact with the nucleation layer and a tunnel junction.

13. The device of claim 12, wherein x=0.2.

14. The method of claim 8, wherein the back surface field forms a heterojunction with the base having a lower barrier height as compared to a back surface field comprised of gallium indium phosphide (GaInP).

15. The method of claim 8, wherein the barrier height allows for thermalization of majority carrier holes down to temperatures less than about −50° C., which eliminates resistive losses associated with the barrier.

16. The method of claim 8, wherein the barrier height eliminates resistive losses.

17. The method of claim 10, wherein the back surface field forms a heterojunction with the base having a lower barrier height as compared to a back surface field comprised of gallium indium phosphide (GaInP).

18. The method of claim 10, wherein the barrier height allows for thermalization of majority carrier holes down to temperatures less than about −50° C., which eliminates resistive losses associated with the barrier.

19. The device of claim 1, wherein the back surface field is either type-I or type-II band alignment relative to the GaInAs base.

20. The device of claim 1, wherein the back surface field maintains a band offset for the conduction band of greater than 0 meV relative to the GaInAs base.

* * * * *